(12) United States Patent
Tabery et al.

(10) Patent No.: US 11,181,829 B2
(45) Date of Patent: Nov. 23, 2021

(54) METHOD FOR DETERMINING A CONTROL PARAMETER FOR AN APPARATUS UTILIZED IN A SEMICONDUCTOR MANUFACTURING PROCESS

(71) Applicant: ASML NETHERLANDS B.V., Veldhoven (NL)

(72) Inventors: Cyrus Emil Tabery, San Jose, CA (US); Hakki Ergün Cekli, Singapore (SG); Simon Hendrik Celine Van Gorp, Oud-Turnhout (BE); Chenxi Lin, Newark, CA (US)

(73) Assignee: ASML Netherlands B.V., Veldhoven (NL)

( * ) Notice: Subject to any disclaimer, the term of this patent is extended or adjusted under 35 U.S.C. 154(b) by 2 days.

(21) Appl. No.: 16/640,088

(22) PCT Filed: Jul. 30, 2018

(86) PCT No.: PCT/EP2018/070605
§ 371 (c)(1),
(2) Date: Feb. 19, 2020

(87) PCT Pub. No.: WO2019/048137
PCT Pub. Date: Mar. 14, 2019

(65) Prior Publication Data
US 2021/0132508 A1  May 6, 2021

Related U.S. Application Data

(60) Provisional application No. 62/555,007, filed on Sep. 6, 2017.

(51) Int. Cl.
*H01L 21/66* (2006.01)
*G03F 7/20* (2006.01)

(52) U.S. Cl.
CPC ........ *G03F 7/70525* (2013.01); *G03F 7/7085* (2013.01); *G03F 7/70558* (2013.01);
(Continued)

(58) Field of Classification Search
CPC ............. G03F 7/70635; G03F 7/70525; G03F 7/70633; G03F 7/70641; G03F 7/7085
(Continued)

(56) References Cited

U.S. PATENT DOCUMENTS 6,368,884 B1  4/2002 Goodwin et al.
8,344,745 B2  1/2013 Aghababazadeh et al.
(Continued)

FOREIGN PATENT DOCUMENTS

CN     103745273    4/2014
EP       1457828    9/2004
(Continued)

OTHER PUBLICATIONS

International Search Report and Written Opinion issued in corresponding PCT Patent Application No. PCT/EP2018/070605, dated Dec. 14, 2018.
(Continued)

*Primary Examiner* — Hung Nguyen
(74) *Attorney, Agent, or Firm* — Pillsbury Winthrop Shaw Pitman LLP

(57) ABSTRACT

A method for determining a control parameter for an apparatus used in a semiconductor manufacturing process, the method including: obtaining performance data associated with a substrate subject to the semiconductor manufacturing process; obtaining die specification data including values of an expected yield of one or more dies on the substrate based on the performance data and/or a specification for the performance data; and determining the control parameter in dependence on the performance data and the die specifica-
(Continued)

tion data. Advantageously, the efficiency and/or accuracy of processes is improved by determining how to perform the processes in dependence on dies within specification.

20 Claims, 12 Drawing Sheets

(52) U.S. Cl.
CPC ...... *G03F 7/70633* (2013.01); *G03F 7/70641* (2013.01); *H01L 22/20* (2013.01)

(58) Field of Classification Search
USPC ...................................... 355/27, 30
See application file for complete search history.

(56) References Cited

U.S. PATENT DOCUMENTS

| | | | | |
|---|---|---|---|---|
| 9,645,191 | B2* | 5/2017 | Walker .................. | G11C 29/50 |
| 2005/0085032 | A1* | 4/2005 | Aghababazadeh ........................ | G01R 31/2831 438/232 |
| 2008/0294280 | A1* | 11/2008 | Okita .................. | G03F 7/70625 700/108 |
| 2012/0008127 | A1 | 1/2012 | Tel et al. | |
| 2012/0310574 | A1* | 12/2012 | Chu ........................ | H01L 22/14 702/81 |
| 2017/0092548 | A1* | 3/2017 | Wang .................. | G01B 11/0616 |

FOREIGN PATENT DOCUMENTS

| | | |
|---|---|---|
| TW | 201316438 | 4/2013 |
| TW | I571908 | 2/2017 |

OTHER PUBLICATIONS

Taiwanese Office Action issued in corresponding Taiwanese Patent Application No. 107130055, dated May 17, 2019.

* cited by examiner

Failure model

Realtime scanner & inline
metrology + process model ->
EPE map

METHOD FOR DETERMINING A CONTROL PARAMETER FOR AN APPARATUS UTILIZED IN A SEMICONDUCTOR MANUFACTURING PROCESS

CROSS-REFERENCE TO RELATED APPLICATIONS

This application is the U.S. national phase entry of PCT Patent Application No. PCT/EP2018/070605, which was filed on Jul. 30, 2018, which claims the benefit of priority of U.S. Patent Application No. 62/555,007, which was filed on Sep. 6, 2017, and which is incorporated herein in its entirety by reference.

BACKGROUND

Field of the Invention

The present invention relates to device manufacturing and in particular to a method for improving the yield of a lithographic process.

Background Art

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. including part of a die, one die, or several dies) on a substrate (e.g., a silicon wafer). Transfer of the pattern is typically via imaging onto a layer of radiation-sensitive material (resist) provided on the substrate. In general, a single substrate will contain a network of adjacent target portions that are successively patterned.

In lithographic processes, it is desirable frequently to make measurements of the structures created, e.g. for process control and verification. Various tools for making such measurements are known, including: scanning electron microscopes, which are often used to measure critical dimension (CD); specialized tools to measure overlay, the accuracy of alignment of two layers in a device; and scatterometers which can measure various properties of patterned substrates.

Having measured a property, such as overlay, across a substrate, known process optimization techniques adjust a related imaging parameter for subsequent exposures of the substrate or other substrates so as to optimize the root mean square error of that property across the substrate. However, this approach is not always optimum.

SUMMARY OF THE INVENTION

The present invention aims to improve yield in a lithographic device manufacturing process.

According to a first aspect of the invention, there is provided a method for determining a control parameter for an apparatus utilised in a semiconductor manufacturing process, the method comprising: obtaining performance data associated with a substrate subject to the semiconductor manufacturing process; obtaining die specification data comprising values of an expected yield of one or more dies on the substrate based on the performance data and/or a specification for the performance data; and determining the control parameter in dependence on the performance data and the die specification data.

Preferably, the specification comprised by the die specification data defines an allowable range of the performance data.

Preferably, the method further comprises: determining, in dependence on a comparison of the performance data and the specification comprised by the die specification data, whether one or more manufacturable dies on a layer of the substrate are to be scrapped; and amending the die specification data such that control parameters for processes performed on the layer, and other layers, of the substrate are not generated in dependence on the manufacturable dies that are determined to be scrapped.

Preferably, the method further comprises amending the die specification data such that control parameters for processes performed on other layers of the substrate are generated in dependence on the manufacturable dies that are not determined to be scrapped.

Preferably, the method further comprises: determining, in dependence on a comparison of the performance data and the specification comprised by the die specification data, to reduce a priority level of one or more of the manufacturable dies on the substrate; wherein the control parameters for the processing of other layers of the substrate are generated in dependence on the priority level of each die.

Preferably, the performance data comprises a plurality of types of performance data; and the comparison of the performance data and the specification comprised by the die specification data comprises a comparison of each type of performance data with a respective specification for that type of performance data.

Preferably, the method further comprises performing, before a manufacturing process is performed on each of a plurality of layers of the substrate, the processes of: obtaining performance data associated the layer of the substrate; obtaining die specification data comprising values of an expected yield of one or more dies on the substrate based on the performance data and/or a specification for the performance data; and determining the control parameter for the manufacturing process in dependence on the performance data and the die specification data.

Preferably, the method further comprises performing processes for determining whether or not to amend the die specification data prior to said processes of obtaining die specification data for a substrate and generating a control parameter for the processing of a layer of the substrate.

Preferably, the die specification data that a control parameter of a layer is generated in dependence on is generated in dependence on determinations on one or more other layers of the same substrate.

Preferably, the determined control parameter is for controlling one or more of a metrology process, an overlay error correction process, a focusing process, an exposure dose provision process, a levelling process, an alignment process and a testing process.

Preferably, the die specification data comprises data on the processing of one or more previously processed layers of the substrate, and the method further comprises generating the control parameter in dependence on the data on the processing of one or more previously processed layers of the substrate.

Preferably, the method further comprises generating and maintaining a record of the die specification data in a database.

According to a second aspect of the invention, there is provided a lithographic processing method, the method comprising: determining one or more control parameters for a process according to the method of the first aspect; and processing a layer of the substrate in dependence on the determined one or more control parameters.

According to a third aspect of the invention, there is provided a die testing method, the method comprising: obtaining die specification data for a substrate; and testing a die on the substrate in dependence on the die specification data; wherein the substrate is generated according to the lithographic processing method according to the second aspect.

According to a fourth aspect of the invention, there is provided a device manufacturing method comprising performing the method of any of the first, second or third aspects in the manufacture of a device.

According to a fifth aspect of the invention, there is provided a computer program comprising instructions that, when executed by a computing system, cause the computing system to perform the method of any of the first, second or third aspects.

According to a sixth aspect of the invention, there is provided a computing system that, in use, performs the method of any of the first, second or third aspects.

BRIEF DESCRIPTION OF THE DRAWINGS/FIGURES

Embodiments of the invention will now be described, by way of example, with reference to the accompanying drawings in which.

Figure 7:
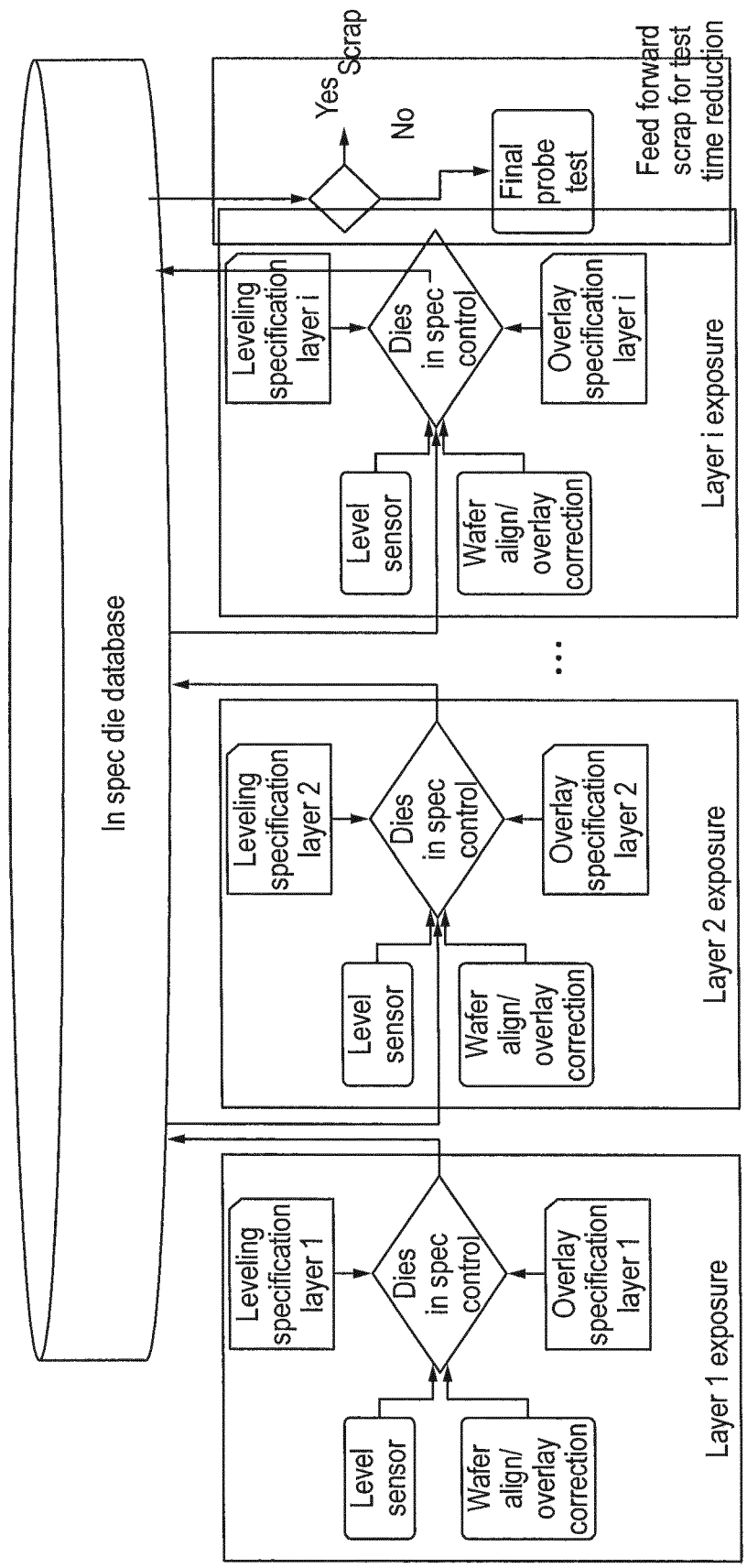
Figure 8:
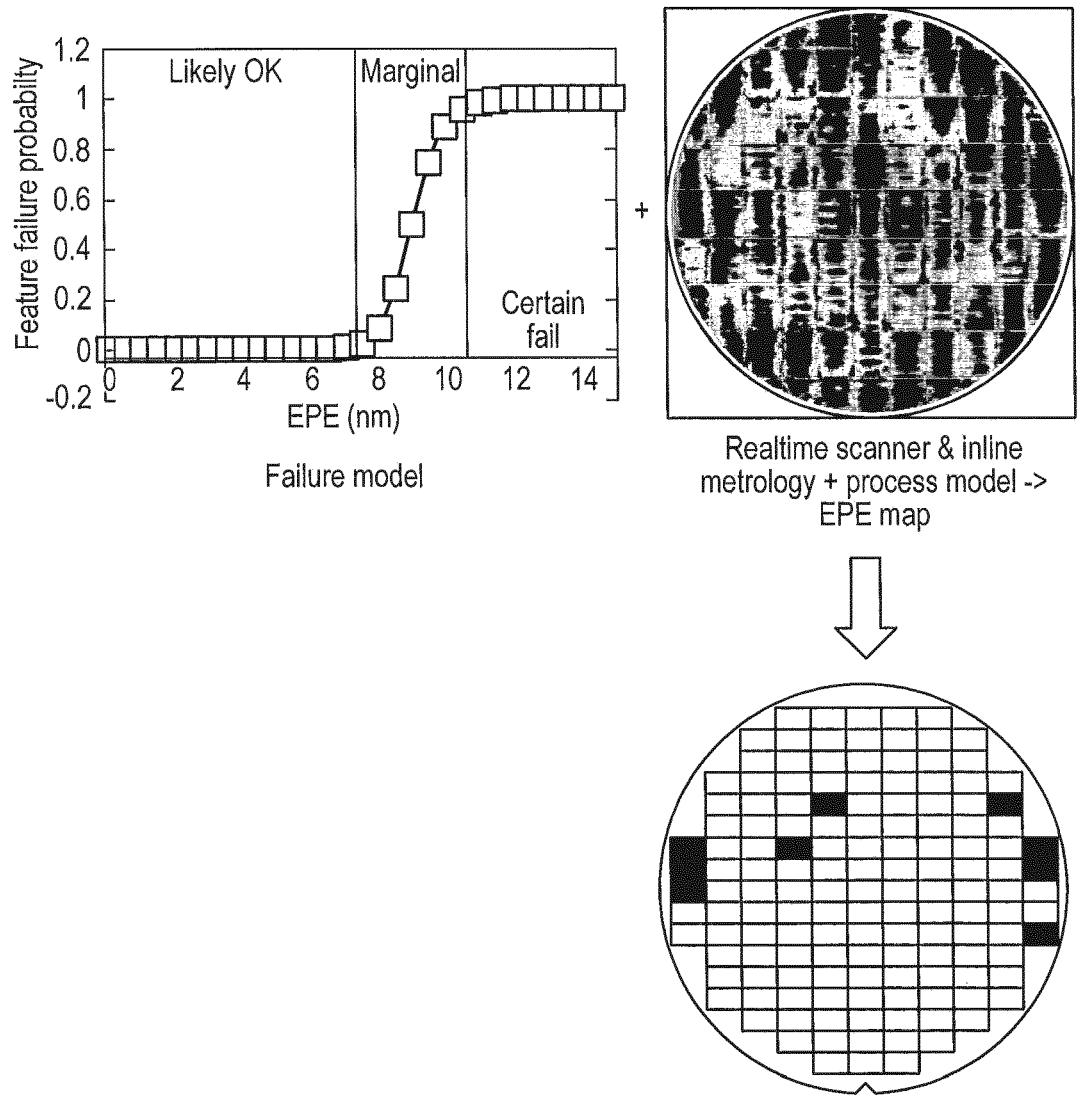
Figure 9:
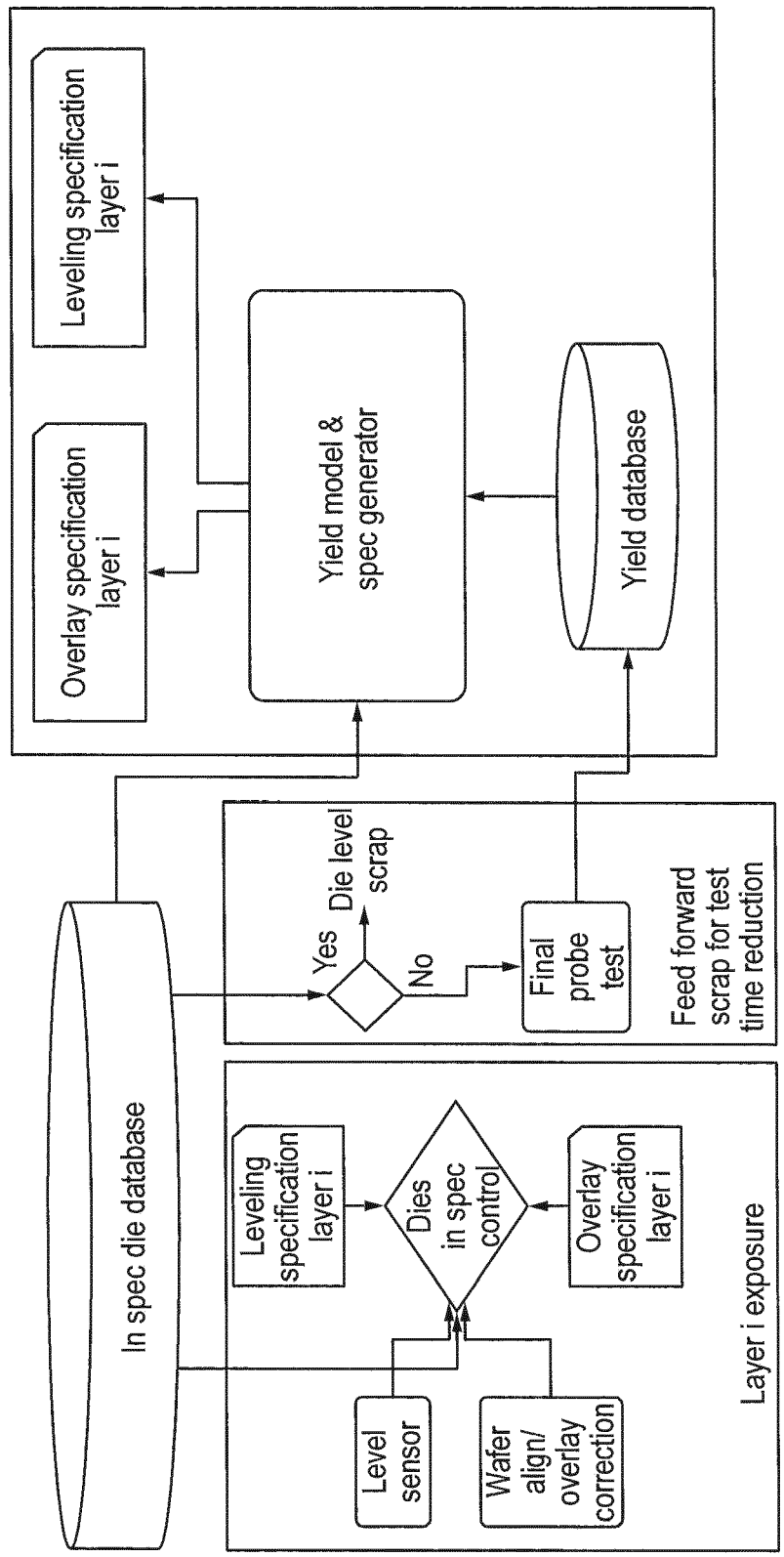
Figure 10:
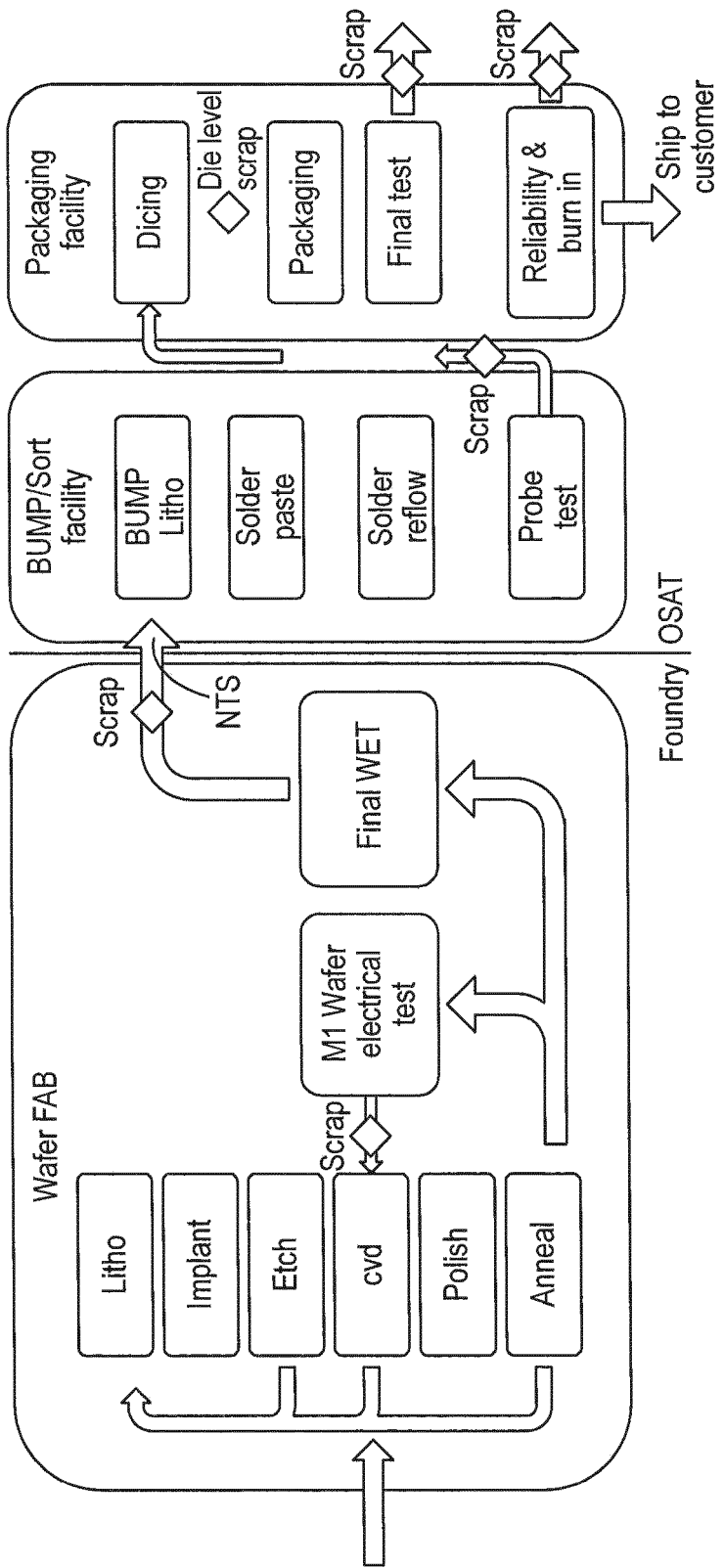
Figure 11:
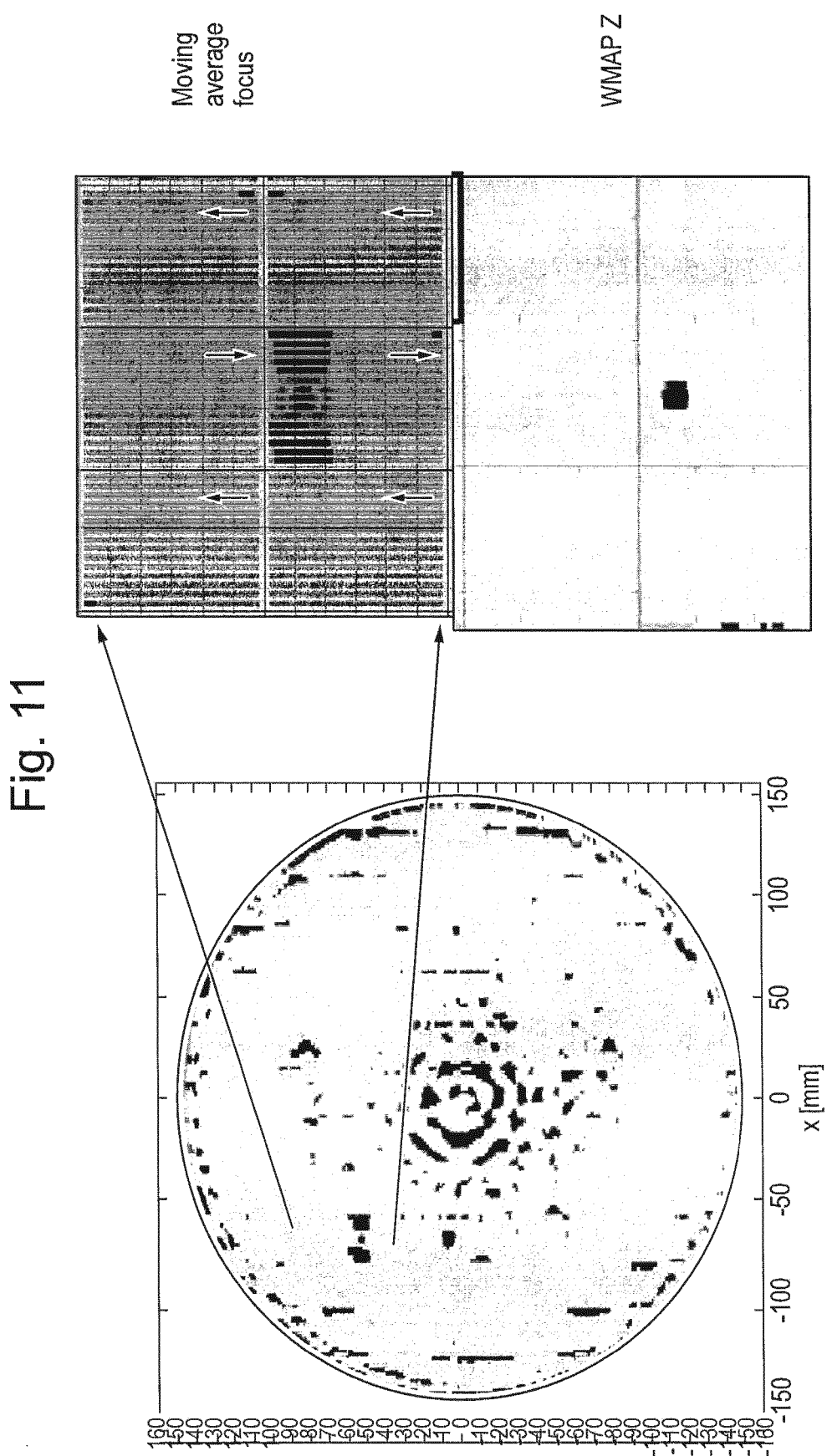
Figure 12:
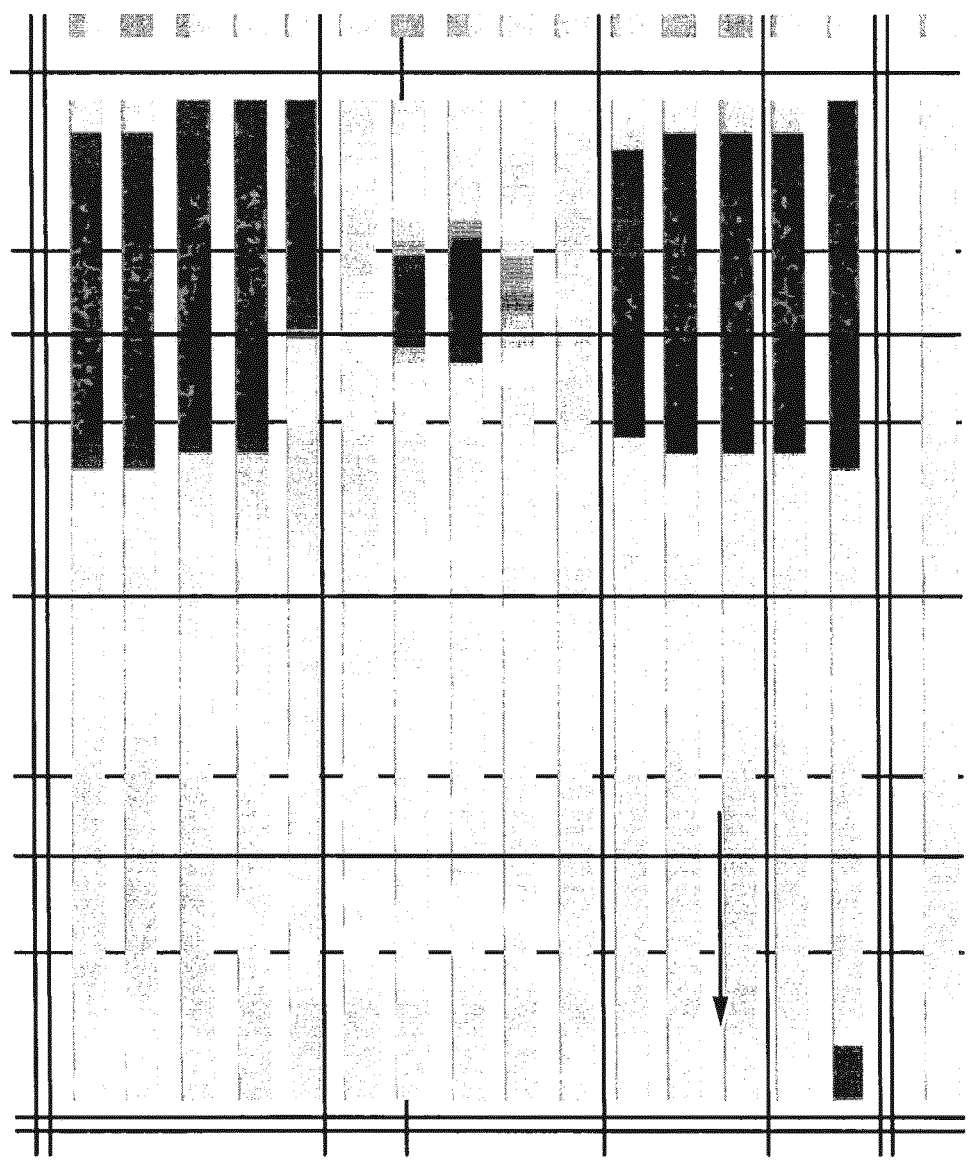
Figure 13:
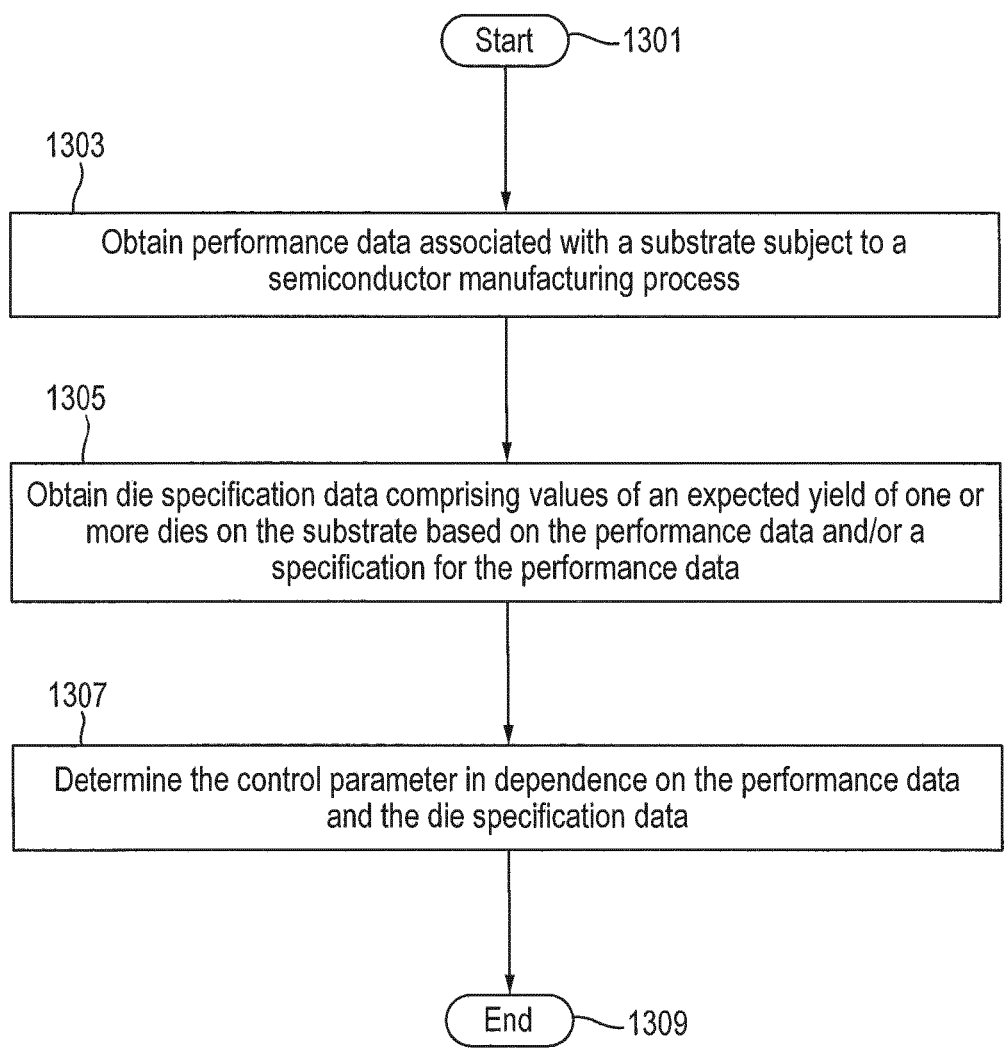

FIG. 7 depicts processes according to an embodiment;
FIG. 8 depicts processes according to an embodiment;
FIG. 9 depicts processes according to an embodiment;
FIG. 10 depicts processes according to an embodiment;
FIG. 11 depicts the effect of a chuck spot on a substrate;
FIG. 12 depicts the effect of a chuck spot on a substrate; and FIG. 13 is a flowchart of a process according to an embodiment.

DETAILED DESCRIPTION

Before describing embodiments of the invention in detail, it is instructive to present an example environment in which embodiments of the present invention may be implemented.

Figure 1:
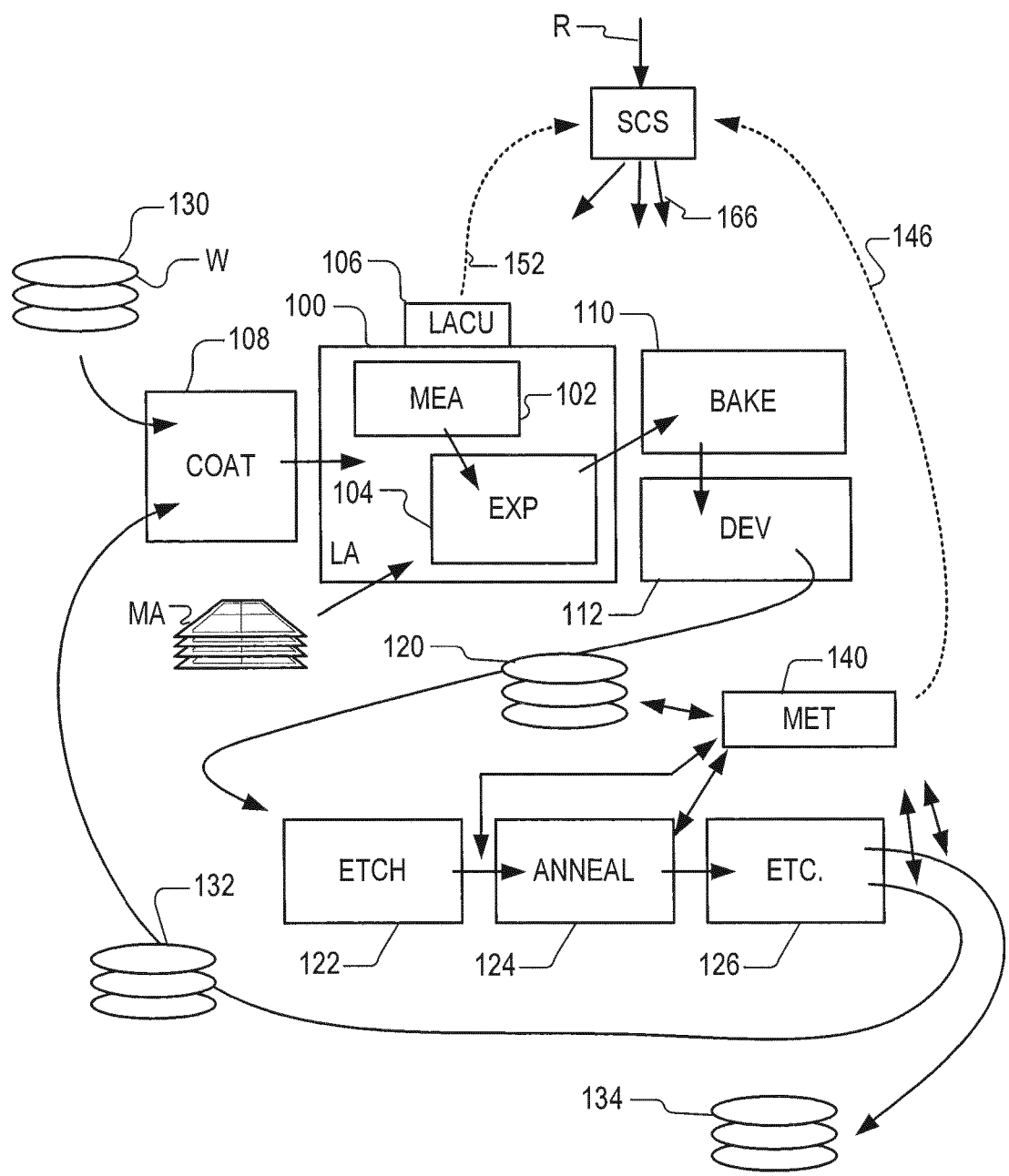
FIG. 1 depicts a lithographic apparatus together with other apparatuses forming a production facility for semiconductor devices.

FIG. 1 illustrates a typical layout of a semiconductor production facility in which an embodiment of the present invention may be put into effect. A lithographic apparatus 100 applies a desired pattern onto a substrate. A lithographic apparatus is used, for example, in the manufacture of integrated circuits (ICs). In that instance, a patterning device, which is alternatively referred to as a mask or a reticle, comprises a circuit pattern of features (often referred to as "product features") to be formed on an individual layer of the IC. This pattern is transferred onto a target portion (e.g., comprising part of, one, or several dies) on a substrate 'W' (e.g., a silicon wafer) via exposure 104 of the patterning device onto a layer of radiation-sensitive material (resist) provided on the substrate. In general, a single substrate will contain a network of adjacent target portions that are successively patterned.

Known lithographic apparatus irradiate each target portion by illuminating the patterning device while synchronously positioning the target portion of the substrate at an image position of the patterning device. An irradiated target portion of the substrate is referred to as an "exposure field", or simply "field". The layout of the fields on the substrate is typically a network of adjacent rectangles aligned in accordance to a Cartesian two-dimensional coordinate system (e.g. aligned along an X and an Y-axis, both axes being orthogonal to each other). One field may be further divided into "dies", a die typically being defined as an area on a reticle or substrate associated with a fully functional integrated circuit layer. Often a reticle comprises circuits of patterns for multiple integrated circuits, a field does then include multiple dies.

A requirement on the lithographic apparatus is an accurate reproduction of the desired pattern onto the substrate. The positions and dimensions of the applied product features need to be within certain tolerances. Position errors may occur due to an overlay error (often referred to as "overlay"). The overlay is the error in placing a first product feature within a first layer relative to a second product feature within a second layer. The lithographic apparatus minimizes the overlay errors by aligning each wafer accurately to a reference prior to patterning. This is done by measuring positions of alignment marks which are applied to the substrate. Based on the alignment measurements the substrate position is controlled during the patterning process in order to prevent occurrence of overlay errors.

An error in a critical dimension (CD) of the product feature may occur when the applied dose associated with the exposure 104 is not within specification. For this reason the lithographic apparatus 100 must be able to accurately control the dose of the radiation applied to the substrate. CD errors may also occur when the substrate is not positioned correctly with respect to a focal plane associated with the pattern image. Focal position errors are commonly associated with non-planarity of a substrate surface. The lithographic apparatus minimizes these focal positon errors by measuring the substrate surface topography using a level sensor prior to patterning. Substrate height corrections are applied during subsequent patterning to assure correct imaging (focusing) of the patterning device onto the substrate.

To verify the overlay and CD errors associated with the lithographic process the patterned substrates are inspected by a metrology apparatus 140. A common example of a metrology apparatus is a scatterometer. The scatterometer conventionally measures characteristics of dedicated metrology targets. These metrology targets are representative of the product features, except that their dimensions are typically larger in order to allow accurate measurement. The scatterometer measures the overlay by detecting an asymmetry of a diffraction pattern associated with an overlay metrology target. Critical dimensions are measured by analysis of a diffraction pattern associated with a CD metrology target. Another example of a metrology tool is an electron beam (e-beam) based inspection tool such as a scanning electron microscope (SEM).

Within a semiconductor production facility, lithographic apparatus 100 and metrology apparatus 140 form part of a "litho cell" or "litho cluster". The litho cluster comprises also a coating apparatus 108 for applying photosensitive resist to substrates W, a baking apparatus 110, a developing apparatus 112 for developing the exposed pattern into a physical resist pattern, an etching station 122, apparatus 124 performing a post-etch annealing step and further processing apparatuses, 126, etc . . . The metrology apparatus is configured to inspect substrates after development (112) or after further processing (e.g. etching). The various apparatus within the litho cell are controlled by a supervisory control system SCS, which controls the lithographic apparatus via lithographic apparatus control unit LACU. The SCS allows the different apparatuses to be operated giving maximum throughput and product yield. An important control mechanism is the feedback 146 of the metrology apparatus 140 to the various apparatus (via the SCS), in particular to the lithographic apparatus 100. Based on the characteristics of the metrology feedback corrective actions are determined to improve processing quality of subsequent substrates.

The performance of a lithographic apparatus is conventionally controlled and corrected by methods such as advanced process control (APC) described for example in US2012008127A1. The advanced process control techniques use measurements of metrology targets applied to the substrate. A Manufacturing Execution System (MES) schedules the APC measurements and communicates the measurement results to a data processing unit. The data processing unit translates the characteristics of the measurement data to a recipe comprising instructions for the lithographic apparatus. This method is very effective in suppressing drift phenomena associated with the lithographic apparatus.

The processing of metrology data to corrective actions performed by the processing apparatus is important for semiconductor manufacturing. In addition to the metrology data also characteristics of individual patterning devices, substrates, processing apparatus and other context data may be needed to further optimize the manufacturing process. The framework wherein available metrology and context data is used to optimize the lithographic process as a whole is commonly referred to as part of holistic lithography. For example context data relating to CD errors on a reticle may be used to control various apparatus (lithographic apparatus, etching station) such that said CD errors will not affect the yield of the manufacturing process. Subsequent metrology data may then be used to verify the effectiveness of the control strategy and corrective actions may be determined.

The use of metrology results is instrumental for the performance of a lithographic process. At the same time the requirements on the relevance of the metrology data are increasing with every shrink (reduction in size of the features manufactured) of the lithographic process. Relevance of the metrology data is only guaranteed when the used metrology targets are representative of the behavior of the product features. This problem is addressed during the design of the metrology target. To mimic the behavior of product features the metrology target may incorporate segmented features, assist features or features with a particular geometry and/or dimension. A carefully designed metrology target responds to process variations in a similar fashion as the product features would do (on average). This allows accurate process control.

The metrology targets further need to be optimally distributed across the substrate and/or reticle. As any unnecessary measurement may affect the throughput of the lithographic process negatively, absence of metrology targets within critical areas may affect the yield of the lithographic process negatively. The technical field related to optimally position and/or optimally measure metrology targets is often referred to as "scheme optimization". A carefully selected metrology scheme is important to optimally control the lithographic process without performing an excessive amount of measurements or sacrificing valuable space on the substrate or reticle to incorporate redundant metrology targets.

Currently control of a lithographic apparatus is to a large extent based on metrology data associated with measurements on targets representative of product features. Metrology data is processed (modeled, interpolated, extrapolated) in order to provide information regarding behavior of a performance parameter (focus, dose, CD, overlay) across the entire substrate, preferably on a dense grid layout. The lithographic apparatus control infrastructure ensures that the processed metrology data is converted to required corrections, which need to be applied during subsequent exposure of the substrate(s).

The required corrections may be implemented by one or more devices arranging one or more of: adjusting the projection lens of the lithographic tool, adjusting dose settings of the lithographic tool, adjusting substrate table control parameters, adjusting the reticle. In general the effectiveness of the corrections is verified by measurements on metrology targets (created during the exposure of the substrate). In this fashion the performance parameter is measured, optimized and verified based on its behavior across the entire substrate. This flow of measurement, optimization (based on correction mechanisms) and verification is an important control strategy adopted for advanced semiconductor manufacturing processes.

As a first adaptation to the "entire substrate" control concept one may ignore the values of the performance parameter associated with dies which are not fully exposed (those dies will never become part of an end-product). This leaves more correction potential to be used to get the fully exposed dies within specification.

As a second adaptation the control strategy may include weighting of performance parameter values with a number representative of the size of a process window at the particular locations on the substrate. The process window is the range of the performance parameter (focus, overlay, CD, dose) for which the lithographic process is performed within specification. For example focus control may be targeted specifically to parts of the die which are known to be susceptible to focus variations, e.g. which have a small process window (in this case with respect to a focus parameter). Less critical parts of the die will then receive sub-optimal focus control, but this will not impact the quality of the product significantly as the less critical parts have a larger process window and accordingly are more tolerant to sub-optimal focus control.

As a third strategy the performance parameter may be controlled based (partially) on an expected dies-in-spec criterion. For example the focus control strategy across a wafer is tailored to optimize the number of dies for which the performance parameter meets a certain criterion; for example the CD variation must remain below 8% of a nominal value of the CD.

For all proposed control strategies it is desirable to have a reliable performance parameter data set on which the control of the lithographic apparatus is based. In practice metrology data availability is limited and sample schemes need to be optimal to provide a sufficiently accurate estimation of a performance parameter distribution (fingerprint) across the substrate. Utilized models to extrapolate and interpolate metrology data need to be realistic and suitable for the metrology data processing. In any case modeling performance parameter data provides the opportunity to assign to a certain location on a substrate an estimate of the uncertainty of the associated performance parameter value. If the model is just an average value of the metrology data (model assumes the performance parameter is constant across the substrate), the uncertainty would be simply the standard deviation of the performance parameter values (as measured across the substrate). In general this applies also to more complex models (polynomial, radial base functions); the uncertainty being the standard deviation of the difference between a measured performance parameter value and an expected performance parameter value (based on a model assumption).

The measure of uncertainty of a performance parameter at a certain location on a substrate may be valuable input for a control strategy. A high uncertainty indicates that the performance parameter may substantially deviate from a desired value. Hence control of the lithographic apparatus may need to be targeted to either a) bring the performance parameter towards a target value or b) accept that high uncertainty areas have a high risk of performance not being within specification and focus control on the areas on the substrate demonstrating a lower uncertainty (e.g. being better controllable). Strategy b) is a variant of the "dies-in-spec" control strategy where most control effort is directed towards a maximum yield of dies which will meet performance specifications. Basically parts of the substrates for which the uncertainty of the performance parameter is high are sacrificed for the benefit of improving the performance parameter associated with areas on the substrate for which the uncertainty of the performance parameter is lower.

The uncertainty metric may be combined with knowledge of how critical the performance parameter control is for features on the substrate. The latter basically expressing a size of the process window across the substrate.

Figure 2A:
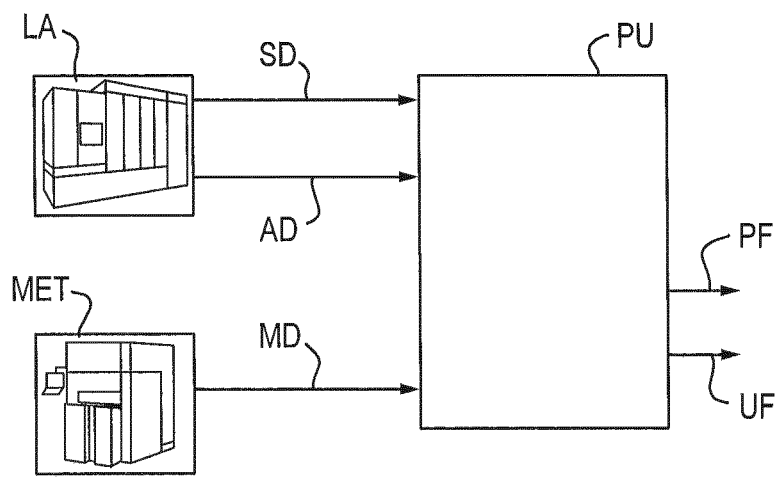
FIG. 2A depicts a process of estimation of a performance parameter fingerprint.
Figure 2B:
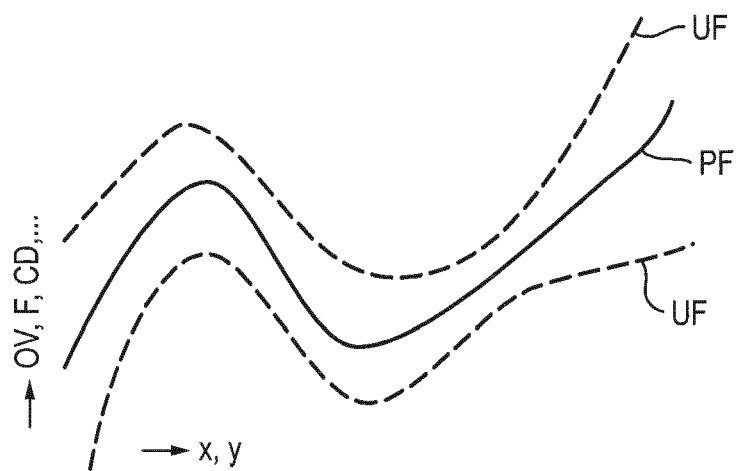
FIG. 2B depicts a performance parameter fingerprint and an uncertainty fingerprint.

A practical implementation of the proposed concept is illustrated by FIGS. 2, 3, 4 and 5. FIG. 2 shows how metrology data MD measured by metrology apparatus MET and data measured by the lithographic apparatus LA (e.g. sensor data SD and/or actuator data AD) are combined in processor unit PU to estimate a fingerprint PF of a performance parameter like CD, overlay or focus. The fingerprint can be estimated across the wafer, hence including variations between fields (=inter-field) or across a field (within the field=intra-field). The fingerprint is estimated and an associated uncertainty fingerprint UF of the performance parameter is derived. The fingerprint of the performance parameter and its uncertainty can be considered as a combined parameter fingerprint. Note that (x,y) denotes a general dependency on the location in the field and on the wafer. The uncertainty fingerprint UF (FIG. 2b) comprises contributions of measurement noise (limited measurement accuracy) and contributions caused by a limited accuracy of the interpolation and extrapolation methods used to estimate performance parameter values.

Figure 3A:
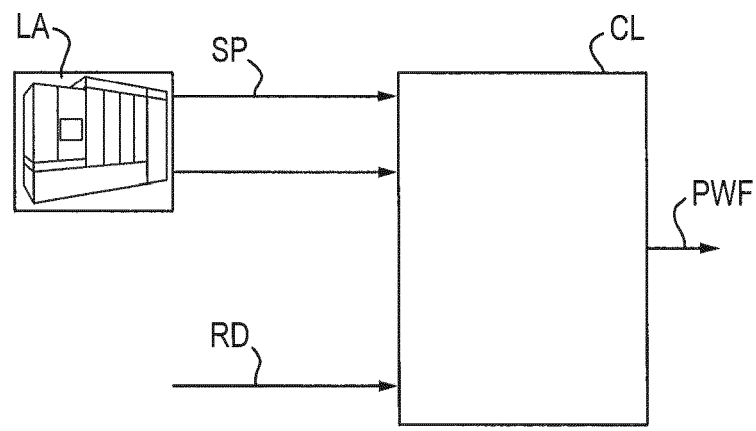
FIGS. 3A and 3B depict a process of computing a process window.
Figure 3B:
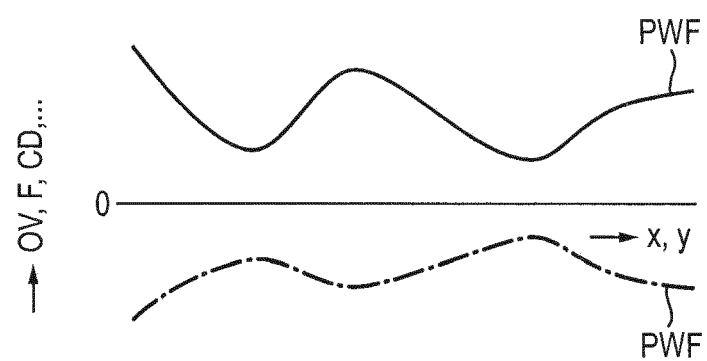

Based on computational or experimental methods the process window and/or margins for the performance parameters are determined, as depicted in FIGS. 3a and 3b. The margins are generally related to the yield of an IC manufacturing process; when the performance parameter exceeds the margins the yield may become unacceptably low. If the process windows are computationally derived, the following input is desirable: the reticle design RD—what features are present and where—and the critical state-parameters SP of the lithographic apparatus—e.g. measured lens aberrations, measured dose characteristics, measured focus control parameters. By measuring/calculating the process window across the substrate using a computational lithography system CL, a process window fingerprint PWF is derived.

It is also desirable to use, as input to the calculation of the process window and or margins, the results of measurements carried out on exposed substrates. For example, defectivity metrology measurements can be used it assist in identifying areas of the substrate where the process window is small.

Based on the determined uncertainty fingerprint and the determined process window fingerprint it is determined at which locations the performance parameter may become out of specification.

Figure 4:
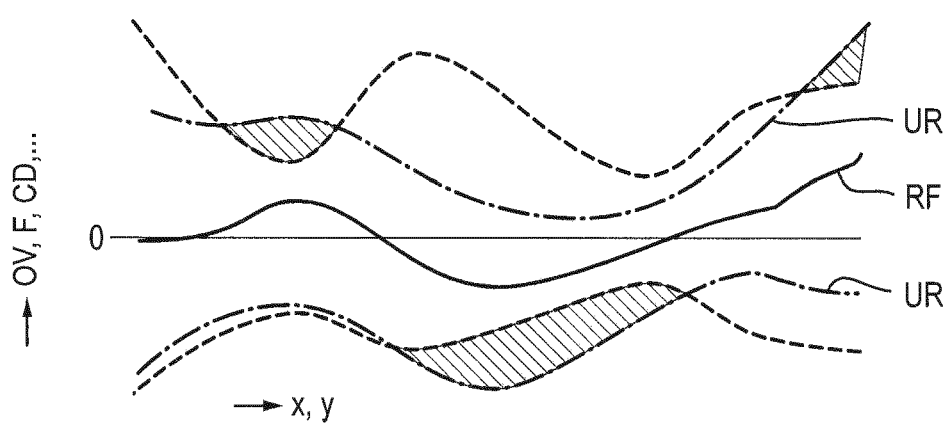
FIG. 4 is a graph showing residual fingerprint, uncertainty fingerprint and process window fingerprint.

The lithographic apparatus achieves control of the performance parameter by utilizing a plurality of correction devices, referred to as actuators. If there were no constraints on the actuation range and spatial characteristics of the correction profile (e.g. what range of profiles are correctable), the lithographic apparatus could be controlled in such a way that the uncertainty fingerprint is centered with respect to the process window fingerprint. In practice, the constraints related to the actuators (e.g. a limited spatial resolution) result in a residual fingerprint RF of the performance parameter, on top of which an uncertainty range UR is superimposed, as illustrated in FIG. 4. The residual fingerprint depends on what correction devices are used and the settings of the utilized correction devices. By careful selection and configuring of the correction devices a high accuracy control (low residual) may be achieved at a first area on the substrate at the cost of a lower accuracy control (higher residual) at a second area on the substrate. In FIG. 4 the residual fingerprint shows a "balanced" behavior, the accuracy of the control is not optimized for a specific area on the substrate, leading to a residual fingerprint that shows only a small variation across the substrate.

In one embodiment the process windows fingerprint, the residual fingerprint and the uncertainty fingerprint are superimposed enabling calculation of the probability that the related performance parameter(s) will be out of specification. In FIG. 4 the hatched areas indicate where on the substrate the probability is above a certain level. This calculated probability can be used to optimize actuator settings for maximum yield of the semiconductor manufacturing process. The actuators may be configured and selected such that a residual fingerprint associated with the actuators will minimize the area of the hatched areas as shown in FIG. 4; the probability of the performance parameter not meeting its specification is then effectively integrated across an area on the substrate (or the entire substrate). The integrated probability may be minimized by selecting and configuring the correction devices. In general also other metrics associated with the probability may be determined (for example the average, maximum or median across the substrate) and used to control the correction devices.

Figure 5:
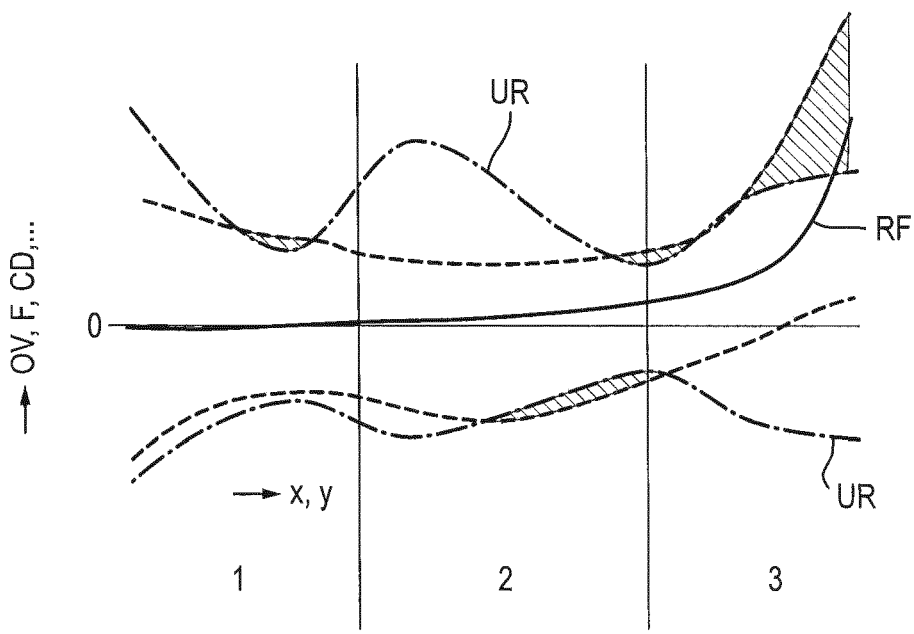
FIG. 5 is a graph showing residual fingerprint, uncertainty fingerprint and process window fingerprint after optimization according to an embodiment of the invention.

In another embodiment in addition to optimization of the probability for the full wafer/field area, we may include the layout of the dies within each field. FIG. 5 illustrates how the yield probability is optimized for a subset of the dies. This may be beneficial for cases where the yield probability of a particular subset of dies is very low, e.g. for dies on the edge of the substrate. In the example depicted in FIG. 5, die number 3 is "sacrificed" in order to improve the yield probability of dies 1 and 2, which are associated with an interior area of the substrate (e.g. remote from the edge of the substrate). It should be noted that ideally the die level optimization should address all performance parameters (dose, focus, overlay) and when needed across multiple layers. If one or more dies are sacrificed in one layer, then it may be desirable that if any sacrifices are necessary in other layers, the same dies should be sacrificed in those other layers.

It is noted that although typically correction devices (actuators) within a lithographic apparatus are used, also correction devices pertaining to processing apparatus like etch stations, tracks (resist development) and other processing equipment may be considered. This is especially relevant when the performance parameter is measured after etch (AEI=after etch inspection) and control of the etch station may significantly improve the CD or overlay parameter across the substrate.

In another embodiment a further optimization may be achieved by optimizing placement of the metrology targets (or optimize selection of the measurement locations associated with the metrology targets or other structures selected for measurement). A sampling scheme optimization can be based only on fingerprint uncertainty and uniformity however it is desirable to also take into account the process window fingerprint/hotspot locations. A hotspot location is a location identified as having a high risk of limiting the yield of the process due to its small process window. Taking the hotspot locations into account may reduce the uncertainty of the performance parameter on the hotspot locations, further improving the number of dies which meet specification.

In another embodiment the yield of the lithographic process is improved by adaptation of the performance parameter data utilized to control the lithographic process. As described before typically lithographic processes are controlled based on performance parameter data. Control is most critical at locations on the substrate where the process window is small; implying that relatively small excursions of the performance parameter may cause substantial yield loss at the locations of interest. An alternative to weighting of performance parameter values (with a number representative of the size of a process window at the particular locations on the substrate) is proposed. It is proposed to modify the performance parameter data before being utilized by the control infrastructure of the lithographic process. For example by amplifying the value of a performance parameter at a certain critical location the controller of the lithographic process may be forced to apply a larger correction to the critical location on the substrate, while, due to limitations of the control strategy, applying less than nominal corrections to locations on the substrate being less critical.

Figure 6A:
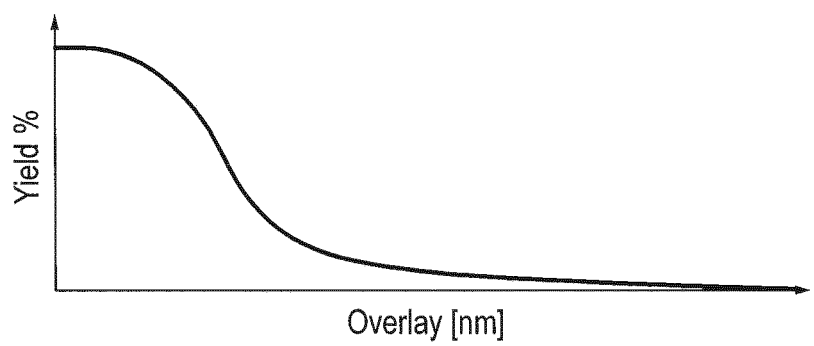
FIG. 6A depicts a yield-performance parameter characteristic associated with a critical location on a substrate.
Figure 6B:
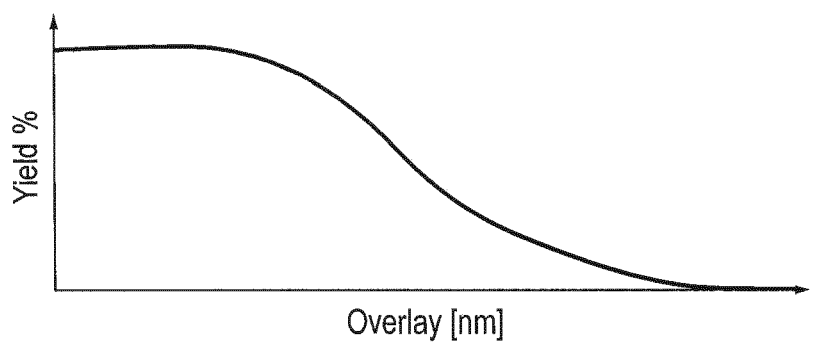
FIG. 6B depicts a yield-performance parameter characteristic associated with a less critical location on a substrate.

The process window in this embodiment is typically represented by a relation between a yield value and the performance parameter value. A process window associated with a critical location is depicted in graph 6A. The yield parameter steeply declines when the performance parameter (in this case overlay) increasingly deviates from its nominal value (here nominal value is 0). A process window associated with a less critical location on the substrate is depicted in FIG. 6B, the yield parameter initially does not change significantly when the overlay starts to increase. Only for large overlay excursions (large deviation of the overlay from its nominal value) the yield steeply declines.

Typically before modification of the performance data, the performance parameter data is normalized or referenced to a reference value. For example when the performance parameter data refers to a Critical Dimension (CD), the critical dimension data may be referenced to a nominal value of the critical dimension. For example when a nominal CD is 40 nm, a (measured) value of a CD may be referenced to its nominal value by subtracting 40 nm from the (measured) value of the CD and optionally divide the acquired value by 40 nm to get a normalized value. Analog to CD values also overlay, focus, dose or Edge Placement Errors (EPE) may be relevant as a performance parameter.

After the (optional) referencing and/or normalizing of the performance parameter data the performance parameter data is modified to provoke a controlled response to the modification which may have a beneficial effect on the yield of the lithographic process. Typically this is achieved by amplifying the performance parameter (eg scaling of the performance parameter values by a factor >1) associated with critical locations on the substrate. Alternatively, or in addition also damping of the performance parameter data associated with less critical locations (eg scaling of the performance parameter by a factor <1) can be implemented.

In response to the modification of the performance parameter data the control system of the lithographic process may correct the performance parameter for the critical locations to a larger extend than the performance parameter for the less critical locations. Effectively the critical locations are then optimized to a greater extend, while sacrificing some performance for the less critical locations on the substrate. Examples of control are: use of lens manipulators within a lithographic apparatus to control a performance parameter fingerprint across at least part of the substrate, use of wafer table actuators to modify positioning of the substrate during the lithographic process and/or use of adjusting thermal actuation of the substrate during an etching process of the substrate.

In an embodiment of the invention a method for improving the yield of a lithographic process is proposed, the method comprising: obtaining performance parameter data associated with at least part of a substrate, wherein the performance parameter data is utilized to control the lithographic process; determining a process window fingerprint of the performance parameter across the at least part of the substrate, the process window being associated with an allowable range of the performance parameter; and modifying the performance parameter data based on a predicted effect of the modifying the performance parameter data on the yield of the lithographic process.

The process window represents a relation between a value of the performance parameter and a value associated with the yield of a location or region on the substrate. Modifying the performance parameter comprises an amplification or damping of a value of the performance parameter. The value of the performance parameter may be referenced or normalized to a reference value before applying the amplification or damping of the performance parameter value. The control of the lithographic process typically comprises adjustment of an actuator associated with an apparatus utilized to perform the lithographic process. The actuator may control one of the following: a lens element, a stage movement, a temperature of an etch process, a direction of an etch process (for example a plasma etching direction).The performance parameter is typically one of the following: overlay, CD, EPE, focus, dose.

Particularly preferred embodiments of the invention are described below in which the overall yield of correctly manufactured devices by the entire manufacturing process is improved. The improvement is gained by determining dies on a substrate that are at high risk of not being manufactured correctly and using this information when determining how to control future manufacturing steps. The future manufacturing steps are controlled in a way that is better directed towards the dies on the substrate that can be successfully manufactured and this advantageously increases the overall yield of successfully manufactured devices.

By way of background, the manufacturing of devices comprises performing processes on each of a plurality of layers of a substrate. The number of layers may be more than 50. The upper surface of each substrate is divided into a plurality of dies. After all of the lithographic processes have been performed on each of the layers, the dies undergo the further manufacturing steps of being diced and packaged before being shipped as manufactured devices.

A number of measurements and tests are performed on the dies throughout the entire manufacturing process. For example, during the manufacture of each layer of the substrate there will typically be a measurement of properties such as the overlay error, CD error and focus errors. As explained in the above-described embodiments, these measurements are preferably used to determine the probability of successful manufacture of dies on the substrate and to thereby improve the control of the processes performed on the layer of substrate so as to improve the yield.

According to the particularly preferred embodiments herein, die specification data is generated in dependence on the probability of successful manufacture of dies on the substrate. The die specification data of a substrate comprises a determination of which dies on a substrate are expected to be manufactured correctly, i.e. good dies. If it is determined that a die has a high probability, or certainty, of not being manufactured correctly then the die is determined to be scrap. The die specification data may include information on all manufacturable dies on the substrate, i.e. both good dies and scrap dies. Embodiments include each die on the substrate as being determined to be in one of the above two states only, i.e. good or scrap.

For each layer of the substrate there is a measurement of performance data, such as the level and overlay properties of some, or all, of the dies on the substrate. The performance data is then compared to a specification for the substrate in order to determine, for each of a plurality of potentially manufacturable dies on the substrate, the probability of the potentially manufacturable die being successfully manufactured. The comparison may be according to any of a number of techniques, including the previously described techniques throughout the present document and the comparison may be in dependence on whether or not the performance data is within the limits of a process window. Other factors that may result in a potentially manufacturable die being determined have a low probability of being manufactured correctly are the determination of unreliable metrology data or when the measurement value of a parameter lies outside of a range of an actuator.

In dependence on the above techniques, dies on the substrate are either classified as being within specification, and therefore good dies, or out of specification and therefore scrap. As shown in FIG. 7, embodiments provide an In Spec Die Database. The database stores the die specification data for a substrate. The initial die specification data may comprise default values. However, following the classification processes performed on the dies of each layer of the substrate, the initial values are changed as appropriate so that they are in accordance with the classification of the potentially manufacturable dies.

FIG. 8 shows a classification processes of dies on a substrate according to embodiments. Edge Placement Error, EPE, is an overall error measurement of the deviation of a feature on a substrate from a desired value. A failure model relates the probability of a yield to the performance data. In FIG. 8, an EPE map of the surface of a substrate is compared with a failure model to determine dies on the substrate that are classified as scrap.

The die specification data is generated and amended over a plurality of layers of the substrate. If a die is classified as scrap on any one layer, then it is also classified as scrap on all subsequent layers. That is to say, if a particular die is determined to be scrap on layer 3 then the die is also determined to be scrap on layer 4 and all other layers.

According to embodiments, the calculation of the control parameters of the processes performed on each layer of a substrate is dependent on the die specification data. The die specification data is used to determine which dies on a substrate are good dies and the control parameters are only determined in dependence on the good dies. Advantageously, the yield of good dies is increased because the control parameters are better directed to improving the yield of good dies, which may be less than all of the dies, on the substrate.

In an alternative to the embodiments as described above, embodiments also include the classification of each die being more detailed than just the two options of good and scrap. As shown by the failure model in FIG. 8, the probability of a die failing may be used to determine if the die is at low risk of failure, at marginal risk or a certain to fail. The respective classifications of each die may therefore be good, marginal or scrap. The die specification data may then only include the good and marginal dies and not the scrap dies. As described in the above-described embodiments, the calculation of the control parameters of the processes performed on each layer of a substrate is dependent on the die specification data. However, the control parameters are now determined in dependence on both the good dies and the marginal dies. Preferably, the good and marginal dies are provided with different weightings so that the control parameters can be generated in dependence on the weightings. The overall yield of correctly manufactured devices may be improved by generating the control parameters in greater dependence on the marginal dies than the good dies. However, generating the control parameters in greater dependence on the good dies than the marginal dies may increase the probability of a desired minimum yield of correctly manufactured dies being achieved.

The number of classification levels is not restricted to two or three. In another embodiment, the calculated probability of a die failing is used to determine one of a plurality of priority levels for the die. There may be any number of priority levels for a die. For example, the number of priority levels may be 10. Dies that are determined to have the lowest priority level are the scrap dies and, and described above, the control parameters are not calculated in dependence on scrap dies. Die specification data is therefore generated for all dies apart from the dies with the lowest priority level. Preferably, each priority level of a die corresponds to a different weighting so that the influence of the die on the calculation of the control parameters is dependent on its priority level.

The die specification data for a substrate comprises one or more specifications that each define an allowable range of the performance data. The die specification data identifies, and/or can be used to identify, at least the dies in specification, i.e. the non-scrap dies, and preferably also provides a priority level, or other classification, for at least all of the dies in specification. The die specification data may also include values of an expected yield of dies on the substrate based on performance data. Preferably, the die specification data also includes the control parameters and any other data that has been used for all of the processes that have been performed on all of the non-scrap dies. Advantageously, the control parameters of a process can therefore be calculated in dependence on the control parameters and other data of previously performed processes on the dies in specification.

Accordingly, for each layer of the substrate, a determination is made of which dies are in specification. The determinations are transmitted to a database that stores die specification data and used to update the die specification data stored therein. Other data may also be transmitted to the database for updating the die specification data, such as priority levels of the dies and details of the processes that have been performed on the dies.

The control parameters for processes performed on each layer of the substrate are determined in dependence on the die specification data. The die specification data may be obtained by querying the database that stores the die specification data or as part of an automatic process for providing the die specification data to any applications that may require it. The database that stores the die specification data therefore allows the die specification data to be fed-forward to other processes in the system so that they can be controlled in dependence on already determined scrap and/or priority data for the dies.

Examples of processes provided with the die specification data include any of a metrology process, an overlay error correction process, a focussing process, an exposure dose provision process, a levelling process, an alignment process and a testing process. For example, a metrology process may use the die specification data to calculate a sampling plan with no, or a reduced number of, sample points in the vicinity of scrap dies.

FIG. 9 shows the die specification data being provided to a yield model and specification generator. The overlay specification data and levelling data are advantageously calculated in dependence on the die specification data. The calculation process is therefore more efficient as calculations are not made for scrap dies. The accuracy of the calculation processes can also be improved by using priority levels of the dies and/or the details of previously performed processes on the substrate. The die specification data is also provided to a final probe test.

As shown in FIG. 10, a number of tests are performed throughout the manufacturing process of a device. The testing processes are time consuming and therefore increase the manufacturing cost. In particular, the cost of the final testing process is a significant proportion of the cost of the device. According to embodiments, the testing processes are all provided with the die specification data and use this to avoid testing dies that have been determined to be scrap. Embodiments therefore improve the overall efficiency all of the testing processes in the manufacture of the device.

FIGS. 11 and 12 demonstrate an advantage of embodiments. The left image in FIG. 11 is of a substrate on which a chuck spot has occurred. A chuck spot occurs when a foreign particle, that should not have been present in the production process, is positioned below the substrate and the substrate deforms locally when it is clamped to the wafer table. The particle has caused a distortion of a portion of the substrate, as shown on the right in FIG. 11 and in FIG. 12.

As can be seen in FIG. 12, the chuck spot has caused, in the horizontal middle top two dies which are located close to the chuck spot, a substantial distortion. Due to the substantial distortion caused by the deformation of the substrate, the large positional deviations of the applied features may not be correctable using lens/stage actuators and, given the low probability of these die being manufactured correctly, these dies are determined to be scrap die. The four other dies in the top two rows, adjacent to the scrap dies, are also distorted by the chuck spot. However, although these dies have been affected by the chuck spot, the distortion is less and it is still possible for these dies to be manufactured correctly if the dies are processed appropriately.

According to known techniques, all of the dies affected by the chuck spot are included in the calculation of control parameters for manufacturing and/or measurement processes performed on the substrate. As a consequence, the processes applied to the four adjacent dies are not appropriate for correctly manufacturing these dies and all six dies affected by the chuck spot are not manufactured correctly.

According to embodiments, the two dies that are distorted by the chuck spot to the extent that they unlikely be manufactured correctly are determined to be scrap. The control parameters are not calculated in dependence on the scrap dies and are instead calculated in a way that is more appropriate for correctly manufacturing the adjacent dies to the scrap dies. Advantageously, the adjacent dies are still manufactured correctly and the yield of good dies is improved.

The die specification data can store all processing and other data for all of the dies, including the scrap dies. The data on the scrap dies is therefore provided together with data on the non-scrap dies. The control parameters for processes are still calculated in dependence on the non-scrap dies only in the same way as described in the above embodiments. An advantage of storing data on processes performed on scrap dies is that there more data is available if it is ever necessary to investigate the manufacturing process to determine, for example, what caused scrap dies to be generated.

FIG. 13 is a flowchart according to an embodiment.

In step 1301, the process begins.

In step 1303, performance data associated with a substrate subject to the semiconductor manufacturing process is obtained.

In step 1305, die specification data comprising values of an expected yield of one or more dies on the substrate based on the performance data and/or a specification for the performance data is obtained.

In step 1307, the control parameter is determined in dependence on the performance data and the die specification data.

In step 1309, the process ends.

While specific embodiments of the invention have been described above, it will be appreciated that the invention may be practiced otherwise than as described.

An embodiment may include a computer program containing one or more sequences of machine-readable instructions configured to instruct various apparatus as depicted in FIG. 1 to perform measurement and optimization steps and to control a subsequent exposure process as described above. This computer program may be executed, for example, within the control unit LACU or the supervisory control system SCS of FIG. 1 or a combination of both. There may also be provided a data storage medium (e.g., semiconductor memory, magnetic or optical disk) having such a computer program stored therein.

Further embodiments of the disclosure are disclosed in the list of numbered embodiments below:

1. A method for determining a control parameter for an apparatus utilised in a semiconductor manufacturing process, the method comprising: obtaining performance data associated with a substrate subject to the semiconductor manufacturing process; obtaining die specification data comprising values of an expected yield of one or more dies on the substrate based on the performance data and/or a specification for the performance data; and determining the control parameter in dependence on the performance data and the die specification data.

2. The method according to embodiment 1, wherein the specification comprised by the die specification data defines an allowable range of the performance data.

3. The method according to embodiment 1 or 2, further comprising:
determining, in dependence on a comparison of the performance data and the specification comprised by the die specification data, whether one or more dies on a layer of the substrate are to be scrapped; and
amending the die specification data such that control parameters for processes performed on the layer, and other layers, of the substrate are not generated in dependence on the dies that are determined to be scrapped.

4. The method according to embodiment 3, further comprising amending the die specification data such that control parameters for processes performed on other layers of the substrate are generated in dependence on the dies that are not determined to be scrapped.

5. The method according to any preceding embodiment, further comprising:
determining, in dependence on a comparison of the performance data and the specification comprised by the die specification data, to reduce a priority level of one or more of the dies on the substrate;
wherein the control parameters for the processing of other layers of the substrate are generated in dependence on the priority level of each die.

6. The method according to any preceding embodiment, wherein the performance data comprises a plurality of types of performance data; and the comparison of the performance data and the specification comprised by the die specification data comprises a comparison of each type of performance data with a respective specification for that type of performance data.

7. The method according to any preceding embodiment, the method further comprising performing, before a manufacturing process is performed on each of a plurality of layers of the substrate, the processes of: obtaining performance data associated the layer of the substrate; obtaining die specification data comprising values of an expected yield of one or more dies on the substrate based on the performance data and/or a specification for the performance data; and determining the control parameter for the manufacturing process in dependence on the performance data and the die specification data.

8. The method according to any preceding embodiment, further comprising performing processes for determining whether or not to amend the die specification data prior to said processes of obtaining die specification data for a substrate and generating a control parameter for the processing of a layer of the substrate.

9. The method according to any preceding embodiment, wherein the die specification data that a control parameter of a layer is generated in dependence on is generated in dependence on determinations on one or more other layers of the same substrate.

10. The method according to any preceding embodiment, wherein the determined control parameter is for controlling one or more of a metrology process, an overlay error correction process, a focusing process, an exposure dose provision process, a levelling process, an alignment process and a testing process.

11. The method according to any preceding embodiment, wherein the die specification data comprises data on the processing of one or more previously processed layers of the substrate, and the method further comprises generating the control parameter in dependence on the data on the processing of one or more previously processed layers of the substrate.

12. The method according to any preceding embodiment, further comprising generating and maintaining a record of the die specification data in a database.

13. A lithographic processing method, the method comprising:
determining one or more control parameters for a process according to the method of any preceding embodiment; and processing a layer of the substrate in dependence on the determined one or more control parameters.

14. A die testing method, the method comprising:
obtaining die specification data for a substrate; and
testing a die on the substrate in dependence on the die specification data;
wherein the substrate is generated according to the lithographic processing method according to embodiment 13.

15. A device manufacturing method comprising performing the method of any preceding embodiment in the manufacture of a device.

16. A computer program comprising instructions that, when executed by a computing system, cause the computing system to perform the method of any of embodiments 1 to 13.

17. A computing system that, in use, performs the method of any of embodiments 1 to 13.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g., having a wavelength of or about 365, 355, 248, 193, 157 or 126 nm) and extreme ultra-violet (EUV) radiation (e.g., having a wavelength in the range of 1-100 nm), as well as particle beams, such as ion beams or electron beams. Implementations of scatterometers and other inspection apparatus can be made in UV and EUV wavelengths using suitable sources, and the present disclosure is in no way limited to systems using IR and visible radiation.

The term "lens", where the context allows, may refer to any one or combination of various types of optical components, including refractive, reflective, magnetic, electromagnetic and electrostatic optical components. Reflective components are likely to be used in an apparatus operating in the UV and/or EUV ranges.

The breadth and scope of the present invention should not be limited by any of the above-described exemplary embodiments, but should be defined only in accordance with the following claims and their equivalents.

The invention claimed is:

1. A method for determining a control parameter for an apparatus utilized in a semiconductor manufacturing process, the method comprising:
    obtaining performance data associated with a substrate subject to the semiconductor manufacturing process;
    obtaining die specification data, the die specification data comprising (i) values of an expected yield of one or more dies on the substrate based on the performance data, or (ii) a specification for the performance data, or (iii) both (i) and (ii); and
    determining, by a hardware computer system, the control parameter in dependence on the performance data and the die specification data.

2. The method according to claim 1, wherein the die specification data comprises a specification for the performance data and the specification comprised by the die specification data defines an allowable range of the performance data.

3. The method according to claim 1, wherein the die specification data comprises a specification for the performance data and further comprising:
    determining, in dependence on a comparison of the performance data and the specification comprised by the die specification data, whether one or more dies on a layer of the substrate are to be scrapped; and
    amending the die specification data such that one or more control parameters for one or more processes performed on the layer, and one or more other layers, of the substrate are not generated in dependence on the dies that are determined to be scrapped.

4. The method according to claim 3, further comprising amending the die specification data such that one or more control parameters for one or more processes performed on one or more other layers of the substrate are generated in dependence on the dies that are not determined to be scrapped.

5. The method according to claim 1, wherein the die specification data comprises a specification for the performance data and further comprising:
    determining, in dependence on a comparison of the performance data and the specification comprised by the die specification data, to reduce a priority level of one or more of the dies on the substrate, wherein one or more control parameters for the processing of one or more other layers of the substrate are generated in dependence on the priority level of each die.

6. The method according to claim 1, wherein the die specification data comprises a specification for the performance data and the performance data comprises a plurality of types of performance data; and
    the comparison of the performance data and the specification comprised by the die specification data comprises a comparison of each type of performance data with a respective specification for that type of performance data.

7. The method according to claim 1, further comprising performing, before a manufacturing process is performed on each of a plurality of layers of the substrate, the processes of:
    obtaining performance data associated with the layer of the substrate;
    obtaining die specification data comprising values of an expected yield of one or more dies on the substrate based on the performance data and/or comprising a specification for the performance data; and
    determining the control parameter for the manufacturing process in dependence on the performance data and the die specification data.

8. The method according to claim 1, further comprising performing one or more processes for determining whether or not to amend the die specification data prior to the processes of obtaining die specification data for a substrate and generating a control parameter for the processing of a layer of the substrate.

9. The method according to claim 1, wherein the die specification data that a control parameter of a layer is generated in dependence on is generated in dependence on a determination on one or more other layers of the same substrate.

10. The method according to claim 1, wherein the determined control parameter is for controlling one or more selected from: a metrology process, an overlay error correction process, a focusing process, an exposure dose provision process, a levelling process, an alignment process and/or a testing process.

11. The method according to claim 1, wherein the die specification data comprises data on the processing of one or more previously processed layers of the substrate, and the method further comprises generating the control parameter in dependence on the data on the processing of one or more previously processed layers of the substrate.

12. The method according to claim 1, further comprising generating and maintaining a record of the die specification data in a database.

13. A device manufacturing method comprising performing the method of claim 1 in the manufacture of a device.

14. A computer program product comprising a non-transitory computer-readable medium having instructions therein, the instructions configured such that, when executed by a computing system, the instructions cause the computing system to at least:
    obtain performance data associated with a substrate subject to a semiconductor manufacturing process;
    obtain die specification data, the die specification data comprising (i) values of an expected yield of one or more dies on the substrate based on the performance data, or (ii) a specification for the performance data, or (iii) both (i) and (ii); and
    determine a control parameter for an apparatus utilized in the semiconductor manufacturing process, in dependence on the performance data and the die specification data.

15. The computer program product of claim 14, wherein the die specification data comprises a specification for the performance data and the specification comprised by the die specification data defines an allowable range of the performance data.

16. The computer program product of claim 14, wherein the die specification data comprises a specification for the performance data and the instructions are further configured to cause the computer system to:
    determine, in dependence on a comparison of the performance data and the specification comprised by the die specification data, whether one or more dies on a layer of the substrate are to be scrapped; and amend the die specification data such that one or more control parameters for one or more processes performed on the layer, and one or more other layers, of the substrate are not generated in dependence on the dies that are determined to be scrapped.

17. The computer program product of claim 14, wherein the die specification data comprises a specification for the performance data and the instructions are further configured to cause the computer system to determine, in dependence on a comparison of the performance data and the specification comprised by the die specification data, to reduce a priority level of one or more of the dies on the substrate, wherein one or more control parameters for the processing of one or more other layers of the substrate are generated in dependence on the priority level of each die.

18. The computer program product of claim 14, wherein the die specification data comprises a specification for the performance data and the performance data comprises a plurality of types of performance data; and the comparison of the performance data and the specification comprised by the die specification data comprises a comparison of each type of performance data with a respective specification for that type of performance data.

19. The computer program product of claim 14, wherein the instructions are further configured to cause the computer system to perform one or more processes for determining whether or not to amend the die specification data prior to the obtaining of die specification data for a substrate and generating of a control parameter for the processing of a layer of the substrate.

20. The computer program product of claim 14, wherein the die specification data that a control parameter of a layer is generated in dependence on is generated in dependence on a determination on one or more other layers of the same substrate.

\* \* \* \* \*